US008546910B2

(12) United States Patent
Yin et al.

(10) Patent No.: US 8,546,910 B2
(45) Date of Patent: Oct. 1, 2013

(54) SEMICONDUCTOR STRUCTURE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignees: Institute of Microelectronics, Chinese Academy of Sciences, Beijing (CN); Beijing NMC Co., Ltd., Beijing (CN)

( * ) Notice: Subject to any disclaimer, the term of this patent is extended or adjusted under 35 U.S.C. 154(b) by 0 days.

(21) Appl. No.: 13/380,723

(22) PCT Filed: Aug. 24, 2011

(86) PCT No.: PCT/CN2011/078873
§ 371 (c)(1),
(2), (4) Date: Dec. 23, 2011

(87) PCT Pub. No.: WO2012/174791
PCT Pub. Date: Dec. 27, 2012

(65) Prior Publication Data
US 2012/0319181 A1    Dec. 20, 2012

(30) Foreign Application Priority Data

Jun. 20, 2011  (CN) .......................... 2011 1 0166549

(51) Int. Cl.
*H01L 21/70* (2006.01)
(52) U.S. Cl.
USPC .................. 257/522; 257/276; 257/E21.564; 257/410; 438/151
(58) Field of Classification Search
USPC .................. 257/288, 317, E29.129, E29.255, 257/410, 276, E21.564, 522; 438/151, 259
See application file for complete search history.

(56) References Cited

U.S. PATENT DOCUMENTS

| 7,095,040 | B2 * | 8/2006 | Iwasaki et al. ................... 257/10 |
| 7,851,313 | B1 * | 12/2010 | Luo et al. ....................... 438/285 |
| 8,106,468 | B2 * | 1/2012 | Wang et al. .................... 257/410 |
| 2004/0155274 | A1 * | 8/2004 | DeBoer et al. ................. 257/296 |
| 2011/0272767 | A1 * | 11/2011 | Yin et al. ....................... 257/412 |
| 2011/0297223 | A1 * | 12/2011 | Krause et al. ................. 136/256 |
| 2012/0171832 | A1 * | 7/2012 | Toh et al. ...................... 438/300 |

* cited by examiner

*Primary Examiner* — Jarrett Stark
*Assistant Examiner* — Shahed Ahmed
(74) *Attorney, Agent, or Firm* — Occhiuti Rohlicek & Tsao LLP

(57) ABSTRACT

The present invention provides a semiconductor structure, which comprises a substrate, a semiconductor base, a cavity, a gate stack, sidewall spacers, source/drain regions and a contact layer; wherein, the gate stack is located on the semiconductor base, the sidewall spacers are located on sidewalls of the gate stack, the source/drain regions are embedded within the semiconductor base and located on both sides of the gate stack, the cavity is embedded within the substrate, and the semiconductor base is suspended over the cavity, the thickness in the middle portion of the semiconductor base is greater than the thicknesses at both ends of the semiconductor base in a direction along the gate length, and both ends of the semiconductor base are connected with the substrate in a direction along the gate width; the contact layer covers exposed surfaces of the source/drain regions. Accordingly, the present invention further provides a method for manufacturing a semiconductor structure, which is favorable for reducing the contact resistance at the source/drain regions, enhancing the device performance, lowering the cost and simplifying the manufacturing process.

10 Claims, 6 Drawing Sheets

SEMICONDUCTOR STRUCTURE AND METHOD FOR MANUFACTURING THE SAME

CROSS REFERENCE TO RELATED APPLICATION

This application is a National Phase application of, and claims priority to, PCT Application No. PCT/CN2011/078873, filed on Aug. 24, 2011, entitled "SEMICONDUCTOR STRUCTURE AND METHOD FOR MANUFACTURING THE SAME", which claimed priority to Chinese Application No. 201110166549.4, filed on Jun. 20, 2011. Both the PCT Application and Chinese Application are incorporated herein by reference in their entireties.

FIELD OF THE INVENTION

The present invention relates to semiconductor manufacturing field, in particular, to a semiconductor structure and a method for manufacturing the same.

BACKGROUND OF THE INVENTION

In order to improve both performance and integration level of integrated circuits, the feature sizes of devices are scaled down according to Moore's law, which nowadays have reached into the nanometer regime. However, power consumption and current leakage become the most concerned issues along with downscaling in dimensions of the devices. Owing to its capability of suppressing short-channel effect and facilitating proportional downscaling of the devices, the Silicon on Insulator (SOI) architecture has become a preferred structure for deep sub-micrometer or nanometer MOS devices.

Along with the development in SOI technology, Malgorzata Jurczak, Thomas Skotnicki and M. Paoli have proposed an innovated SOI device—Silicon on Nothing (SON) device structure, in which the channel region is deposed on a cavity, in the article "Silicon-on-Nothing—an Innovative Process for Advanced CMOS" (IEEE TRANSACTIONS ON ELECTRON DEVICES, vol. 47, NO. 11, November 2000).

SON (Silicon on Nothing) is an advanced technology developed by CEA-Leti and STmicroelectronics for manufacturing CMOS at 90 nm or below technical nodes; since SON proposes to form a localized SOI (silicon on insulator) under a channel through a "cavity" architecture, the cavity may indicate an air gap or an oxide filling. As compared to an SOI device, the dielectric constant of the cavity architecture is significantly reduced, which considerably smoothes the two-dimensional electrical field effect of the buried oxide layer, and significantly reduces DIBL; the thickness of the silicon film and the height of the cavity may be controlled to produce an optimized short-channel characteristics and to achieve a rather steep sub-threshold slope; meanwhile, the self-heating effect of SOI devices is alleviated; additionally, it is applicable to use bulk silicon wafers as original wafers instead of expensive SOI wafers. As such, SON is regarded as a preferred architecture for substituting SOI technology.

The most critical issue in manufacturing an SON device is how to manufacture a cavity layer. When the SON architecture was first proposed, it made use of an epitaxial SiGe sacrificial layer process. Later, another article revealed a method for manufacturing an SON device through He ion implantation accompanied with annealing or through H—He ion co-implantation accompanied with annealing. The process of epitaxial SiGe sacrificial layer increases the number of steps for manufacturing the device, and increases complexity of the process as well. However, along with downscaling of feature sizes of devices, the ion implantation processes also encounter problems because of requirement of ultra-shallow junction depth of the devices. In a word, there are still lots of challenges remain in the prior art to be tackled when making use of the current processes for manufacturing ultra-large-scale integrated circuits.

Because the contact resistance between contact vias and source/drain regions will not decrease proportionally to the downscaling of the transistor size, thus reducing the contact resistance at the source/drain regions becomes a critical factor to improve performance of transistors. A metal silicide contact layer is widely used in the deep sub-micrometer or smaller MOS transistors to reduce contact resistance at the source/drain regions. However, in SON devices, how to manufacture a contact layer and how to increase the area of a contact layer still face many challenges.

SUMMARY OF THE INVENTION

The present invention aims to at least overcome abovementioned technical shortcomings, and to provide a semiconductor structure and a method for manufacturing the same, which is capable of reducing contact resistance at source/drain regions, improving device performance, lowering cost and simplifying the manufacturing process.

In order to achieve aforesaid objectives, the present invention provides a semiconductor structure, which comprises a substrate, a semiconductor base, a cavity, a gate stack, sidewall spacers, source/drain regions and a contact layer; wherein:

the gate stack is located on the semiconductor base;

the sidewall spacers are located on sidewalls of the gate stack;

the source/drain regions are embedded within the semiconductor base and located on both sides of the gate stack;

the cavity is embedded within the substrate;

the semiconductor base is suspended over the cavity, the thickness in the middle portion of the semiconductor base is greater than the thickness at both ends of the semiconductor base in a direction along the gate length, and both ends of the semiconductor base are connected with the substrate in a direction along the gate width;

the contact layer covers the exposed surfaces of the source/drain regions.

The contact layer may be made of one of $TiSi_2$, $CoSi_2$, $NiSi$ and $PtSi_2$, or combinations thereof.

Accordingly, the present invention further provides a method for manufacturing a semiconductor structure, which comprises:

(a) providing a substrate, forming a gate stack on the substrate, and forming sidewall spacers on sidewalls of the gate stack;

(b) forming recesses in the substrates on both sides of the gate stack, and etching through the recesses on both sides of the gate stack by wet etching to form a cavity, thereby forming the semiconductor base by a portion of the substrate suspended over the cavity;

(c) forming source/drain regions within the semiconductor bases on both sides of the gate stack;

(d) forming a contact layer to cover the exposed surfaces of the source/drain regions.

The method for forming the recesses may comprise:

forming a mask layer on the substrate and the gate stack;

covering the mask layer with a photoresist layer, forming openings on the photoresist layer by exposure and development; wherein the openings are located on both sides of the gate stack;

etching portions of the mask layer in the openings and removing the photoresist;

etching the substrate to form recesses on both sides of the gate stack.

The step of forming the contact layer comprises:

forming a metal layer on the exposed surfaces of the source/drain regions; the metal layer is made of one of Co, Ni, Pt and Ti, or combinations thereof;

annealing to enable the metal layer to react with the exposed surfaces of the source/drain regions;

removing unreacted portions of the metal layer.

According to the semiconductor structure and the method for manufacturing the same provided by the present invention, a SON (silicon-on-nothing) device structure shall be manufactured on a common bulk wafer by means of conventional semiconductor etching process, which significantly simplifies the manufacturing process, lowers cost and improves efficiency. Meanwhile, by forming a contact layer in a semiconductor device, the contact resistance at the source/drain regions is reduced, and performance of a semiconductor device is improved accordingly.

BRIEF DESCRIPTION OF THE DRAWINGS

Aforesaid and/or other characteristics and advantages of the present invention are made more evident according to perusal of the following detailed description of exemplary embodiment(s) in conjunction with accompanying drawings, wherein.

DETAILED DESCRIPTION OF THE INVENTION

Figure 1:
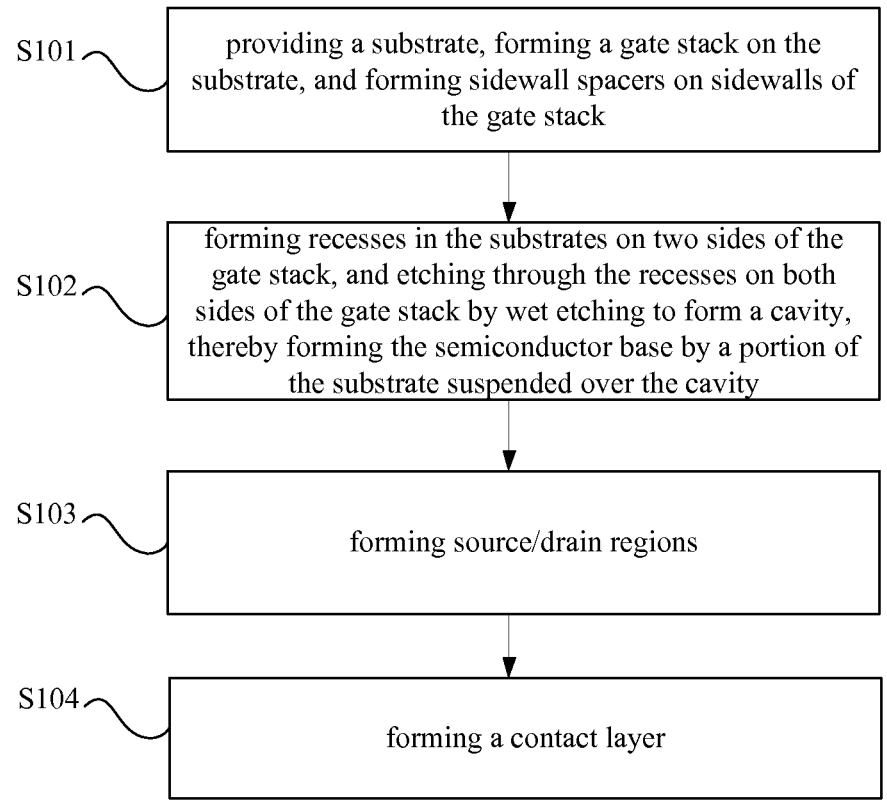
FIG. 1 illustrates a flowchart of a method for manufacturing a semiconductor structure according to an embodiment of the present invention.

Embodiments of the present invention are described in detail here below, wherein the examples of the embodiments are illustrated in the drawings, in which same or similar reference signs throughout denote same or similar elements or elements have same or similar functions. It should be appreciated that the embodiments described below in conjunction with the drawings are illustrative, and are provided for explaining the prevent invention only, thus shall not be interpreted as limitations to the present invention. Various embodiments or examples are provided here below to implement different structures of the present invention. To simplify the disclosure of the present invention, description of the components and arrangements of specific examples is given below. Of course, they are illustrative only and not limiting the present invention. Moreover, in the present invention, reference numbers and/or letters may be repeated in different embodiments. Such repetition is for the purpose of simplification and clearness, yet does not denote the relationship between respective embodiments and/or arrangements being discussed. Furthermore, the present invention provides various examples for various process and materials. However, it is obvious for a person of ordinary skill in the art that other processes and/or materials may alternatively be utilized. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other.

Figure 11:
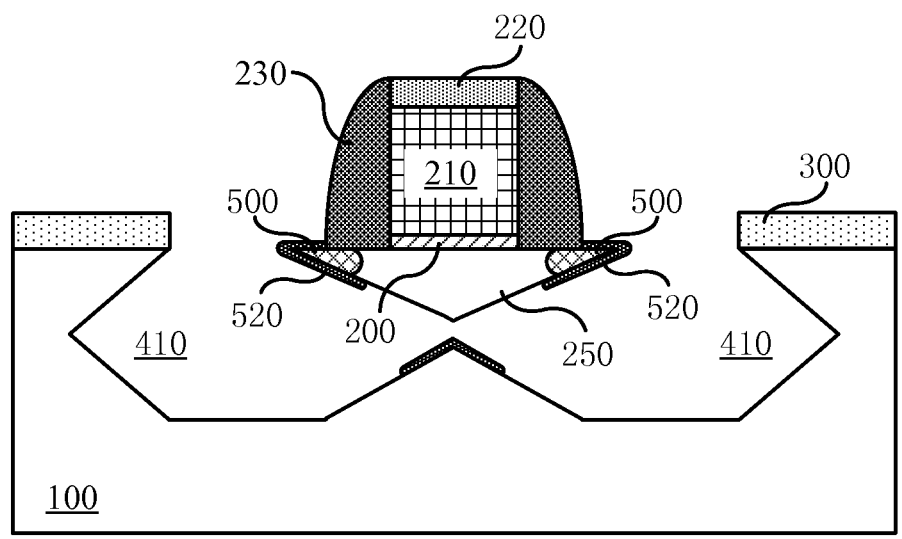

First, with reference to FIG. 11, a semiconductor structure provided by the present invention is generally described below. The semiconductor structure comprises a substrate 100, a semiconductor base 250, a cavity 410, a gate stack, sidewall spacers 230, source/drain regions 500 and a contact layer 520; wherein:

the gate stack is located on the semiconductor base 250;

the sidewall spacers 230 are located on both sidewalls of the gate stack;

the source/drain regions 500 are embedded within the semiconductor base 250 and located on both sides of the gate stack;

the cavity 410 is embedded within the substrate 100;

the semiconductor base 250 is suspended over the cavity 410; the thickness in the middle portion of the semiconductor base 250 is greater than the thickness at both ends of the semiconductor base in a direction along the gate length, and both ends of the semiconductor base 250 are connected with the substrate in a direction along the gate width;

the contact layer 520 covers the source/drain regions 500.

The gate stack may comprise a gate dielectric layer 200 and a gate 210; optionally, the gate stack may further comprise an overlying layer 220 located on the gate.

The contact layer 520 may be made of one of $TiSi_2$, $CoSi_2$, $NiSi$ and $PtSi_2$, or combinations thereof.

The method for manufacturing the semiconductor structure is described here below.

With reference to FIG. 1, the method comprises:

at step S101, providing a substrate 100, forming a gate stack on the substrate 100, and forming sidewall spacers 230 on both sidewalls of the gate stack;

at step S102, forming recesses 400 in the substrates on both sides of the gate stack; wet etching the recesses 400 on both sides of the gate stack to make them through to form a cavity 410; the portion of the substrate suspended over the cavity 410 forming the semiconductor base 250;

at step S103, forming source/drain regions 500;

at step S104, forming a contact layer 520.

Step S101 through step S104 are described below in conjunction with FIGS. 2 to 11. However, it should be noted that the drawings for respective embodiments are provided for illustration only, thus are not necessarily drawn to scale.

Figure 2:
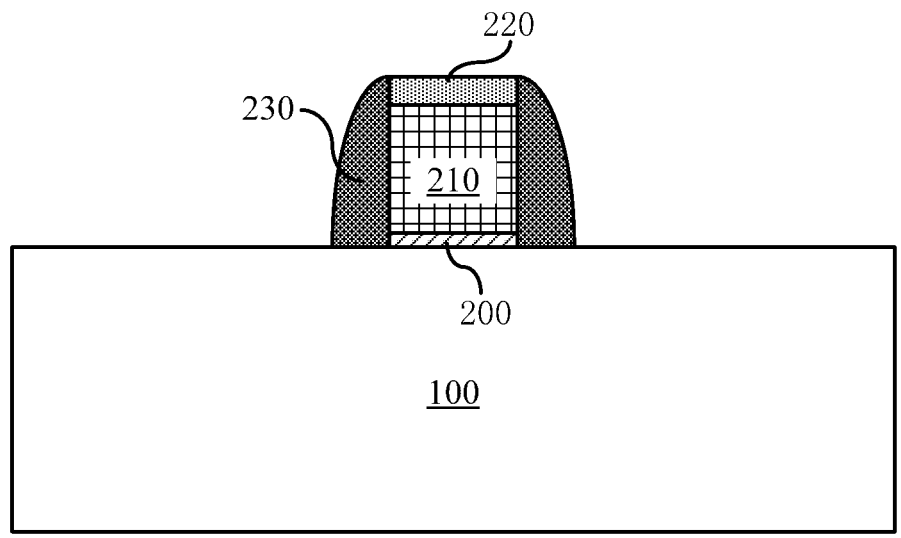
FIGS. 2 to 11 illustrate cross-sectional structural diagrams of a semiconductor structure at respective stages of the method for manufacturing a semiconductor structure according to the embodiment of the present invention as shown in FIG. 1.

With reference to FIG. 2, a substrate 100 is provided at step S101; then a gate stack is formed on the substrate 100, and sidewall spacers 230 are formed on sidewalls of the gate stack. The gate stack comprises a gate dielectric layer 200 and a gate 210; optionally, the gate stack further comprises an overlying layer 220 located on the gate.

In the present embodiment, the substrate 100 is monocrystalline silicon. Preferably, the crystal orientation of the substrate is {100}. According to the design requirement in the prior art (e.g. a P-type substrate or an N-type substrate), the substrate 100 may be of various doping configurations. The substrate 100 in other embodiments may further comprise monocrystalline Ge, monocrystalline SiGe or combinations thereof. Typically, the thickness of the substrate 100 may be, but not limit to, several hundred micrometers, which for example may be in the range of 400 μm-800 μm.

At formation of the gate stack, the gate dielectric layer 200 is formed first on the substrate 100. In the present embodiment, the gate dielectric layer 200 may comprise $SiO_2$, $Si_3N_4$ or combinations thereof, while in other embodiments, the gate dielectric layer 200 may comprise a high-k dielectric, for example, any one of $HfO_2$, HfSiO, HfSiON, HfTaO, HfTiO, HfZrO, $Al_2O_3$, $La_2O_3$, $ZrO_2$, and LaAlO, or combinations thereof, whose thickness may be 1 nm-5 nm, for example, 2 nm or 4 nm. The gate 210 may be consisted of heavily doped poly-silicon formed by means of deposition. Alternatively, a work function metal layer is formed first (for NMOS, for example TaC, TiN, TaTbN, TaErN, TaYbN, TaSiN, HfSiN, MoSiN, $RuTa_x$, $NiTa_x$ or the like; for PMOS, for example, $MoN_x$, TiSiN, TiCN, TaAlC, TiAlN, TaN, $PtSi_x$, $Ni_3Si$, Pt, Ru, Ir, Mo, HfRu, $RuO_x$), and its thickness may be 1 nm~20 nm, for example, 3 nm, 5 nm, 8 nm, 10 nm, 12 nm or 15 nm. Then, heavily doped poly-silicon, Ti, Co, Ni, Al, W or their alloy is formed on the work function metal layer so as to form the gate 210. Finally, an overlying layer 220 is formed on the gate 210 by means of, for example, depositing $Si_3N_4$, $SiO_2$, $Si_2N_2O$, SiC or combinations thereof, for the purpose of protecting the top surface of the gate 210.

Next, sidewall spacers 230 are formed on both sidewalls of the gate stack for isolating and protecting the gate. The sidewall spacers 230 may be formed with $Si_3N_4$, $SiO_2$, $Si_2N_2O$, SiC or combinations thereof, and/or other material as appropriate, and may be in a multi-layer structure. The sidewall spacers 230 may be formed through a depositing and etching process, and its thickness may be in the range of 10 nm-100 nm, for example, 30 nm, 50 nm or 80 nm.

Figure 3:
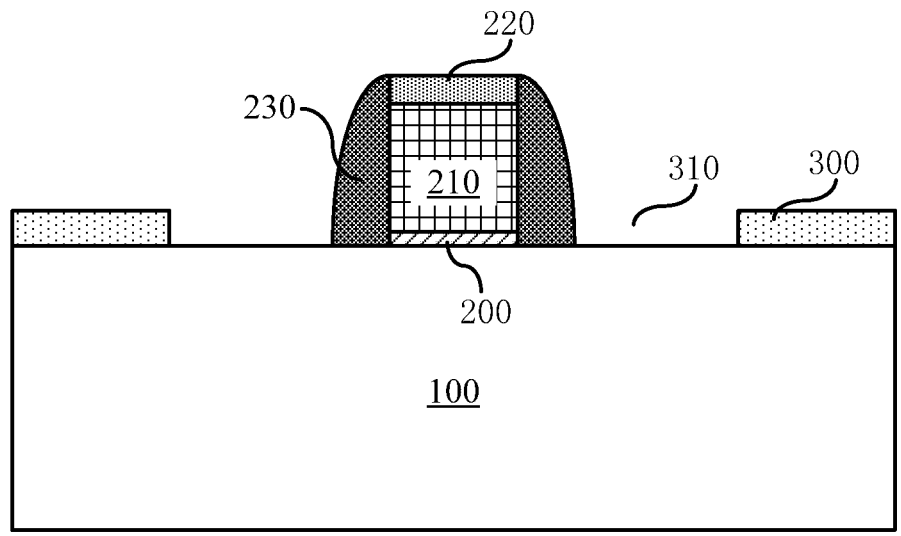
Figure 4:
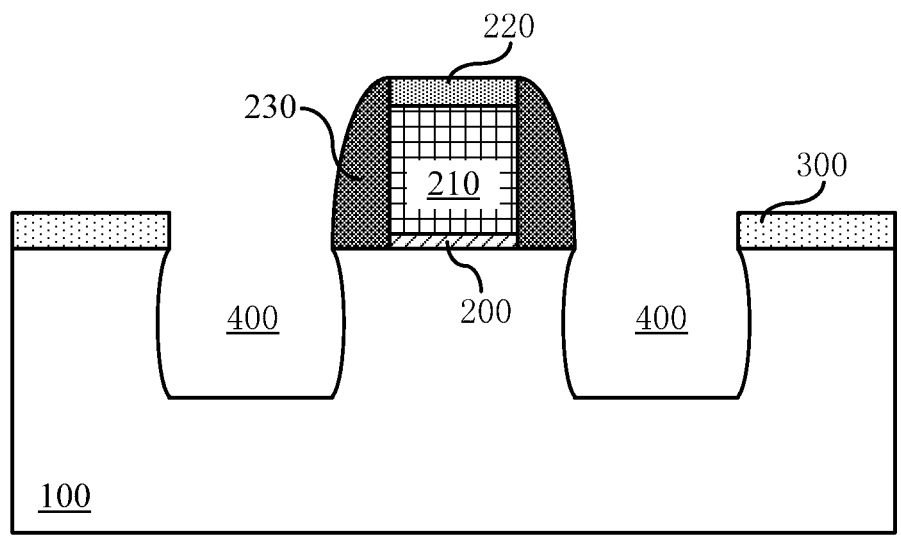
Figure 5:
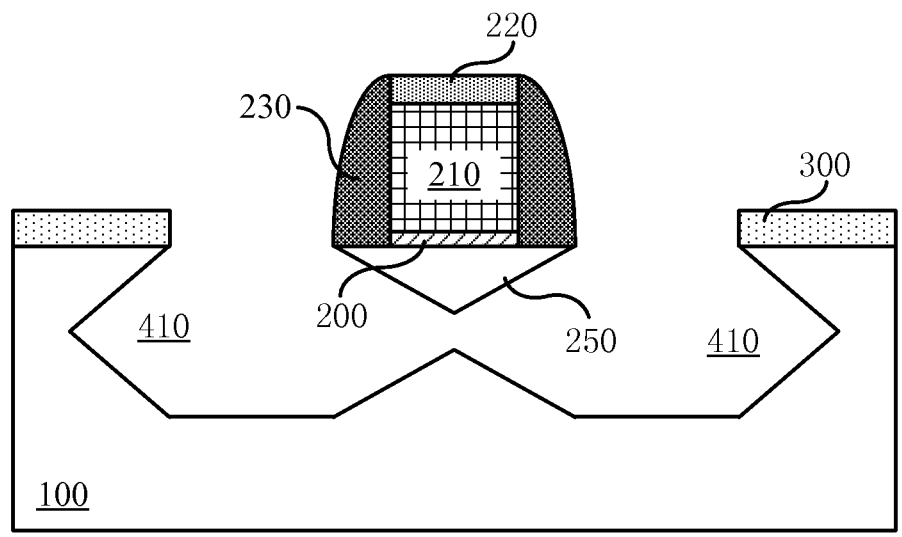

With reference to FIG. 3, FIG. 4 and FIG. 5, recesses 400 are formed in the substrates on both sides of the gate stack at step S102. Then the recesses 400 on both sides of the gate stack are wet etched to make them through to form a cavity 410, whereby a portion of the substrate suspended over the cavity 410 forms the semiconductor base 250.

First, recesses 400 are formed on the substrate 100. Specifically, a mask layer 300 may be formed on the substrate 100 and the gate stack. Then the mask layer 300 is covered with a photoresist layer, on which openings are formed by means of exposure and development, wherein the openings are located on both sides of the gate stack, and the photoresist is not shown in the drawings. The mask layer 300 inside the openings is etched, then openings 310 are formed on the mask layer, and the photoresist is removed, as shown in FIG. 3. In the present embodiment, the openings 310 are in contact with the sidewall spacers 230 on respective side. In other embodiments of the present invention, the openings 310 and the sidewall spacers 230 also may be separated by portions of the mask layer 300. Appropriate configuration may be implemented according to the size of the semiconductor device as designed. Then, the substrate 100 is etched to form recesses 400 on both sides of the gate stack, as shown in FIG. 4. The mask layer 300 may comprise $SiO_2$, $Si_3N_4$, $Si_2N_2O$ or combinations thereof, and it may be formed on the substrate by means of Chemical Vapor Deposition or other method as appropriate. The method for etching the mask layer includes dry etching RIE, or wet etching with an appropriate etching solution. The thickness of the mask layer may be controlled according to the design requirements, which is in the range of 1~5 μm. The method for etching the substrate to form recesses 400 is dry etching RIE. Steep sidewalls may be achieved by way of adjusting and controlling the flow rate and composition of the gas and power at the RIE device. Alternatively, lateral etching may be enhanced as is needed. In the present embodiment, the recesses 400 structured through dry etching have substantially vertical sidewalls; in the following wet etching process, the recesses 400 on both sides of the gate stack are made through each other ascribing to anisotropic property of wet etching. In other embodiments of the present invention, it is also applicable to adjust the parameters of dry etching RIE so as to enhance the extent of lateral etching that shapes the recesses 400, which therefore is favorable for making the recesses 400 through at subsequent steps.

As shown in FIG. 5, after the recesses 400 are formed in the substrates on both sides of the gate stack, the recesses 400 are continually etched through wet etching, such that the recesses on both sides of the gate stack are made through to form a cavity 410, whereby the portion of the substrate suspended over the cavity forms the semiconductor base 250. Source/drain regions may be formed within the semiconductor base 250 in subsequent steps. Meanwhile, the semiconductor base 250 also functions as a channel region of the semiconductor device. Both end portions of the semiconductor base are connected with the substrate 100 in the direction along the gate width. In the present embodiment, the crystal orientation of the substrate is <100>; the etching solution for the wet etching may comprise KOH, TMAH, EDP or combinations thereof, whose concentration may be 5~40% by mass and the temperature for the wet etching may be at 40° C.~90° C. Since the etching solution like KOH, TMAH exhibits anisotropic property against monocrystalline silicon, and the ratio of the speed of etching the {111} crystal face to the speed of etching other crystal faces is about 1:100, thus the {111} crystal face is hardly etched. As shown in FIG. 5, the sidewalls of the cavity 410 are all etching stop faces, while the crystal face thereof is {111}. The recesses are made through by means of anisotropic etching.

Figure 6:
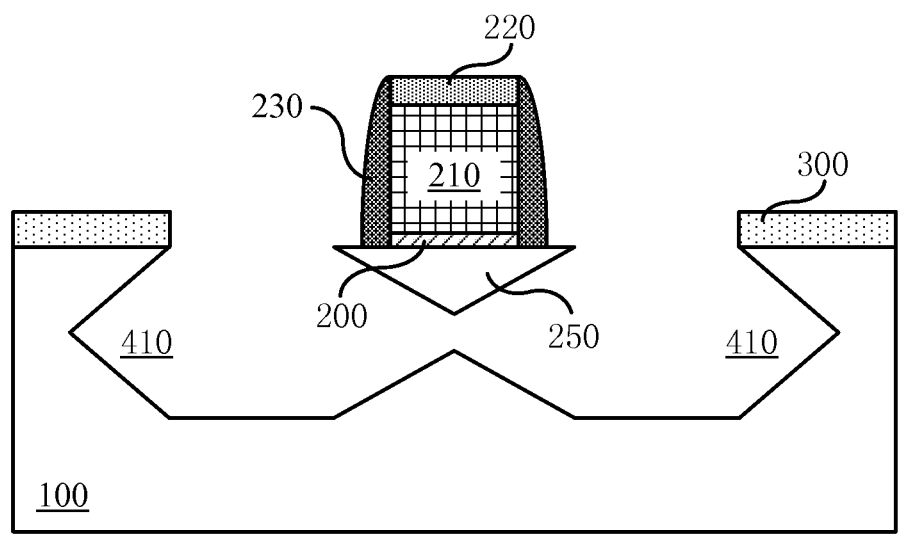
Figure 7:
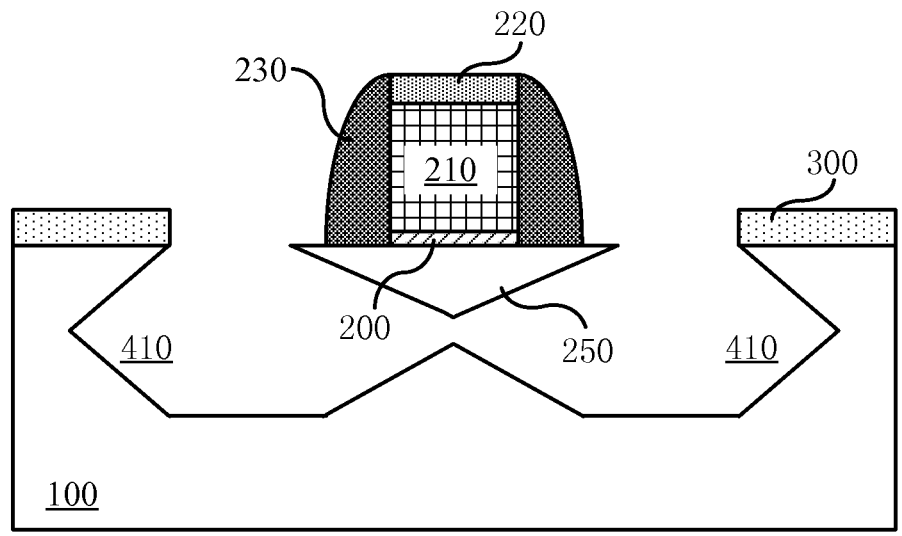

Step S103 is implemented to form source/drain regions 500. The source/drain regions 500 are formed by means of ion implantation, diffusion, in-situ doping epitaxy or combinations thereof. First, as shown in FIG. 6 and FIG. 7, the semiconductor base 250 is partly exposed through etching the sidewall spacers 230 or through an epitaxy method. Specifically, as shown in FIG. 6, the sidewall spacers 230 are partly etched to expose a portion of the semiconductor base 250 suspended over the cavity 410. In another embodiment of the present invention, as shown in FIG. 7, epitaxy is implemented instead of etching the sidewall spacers 230 to form an epitaxial semiconductor layer at the edge of the semiconductor base 250 and on the surface of the cavity 410, such that the semiconductor base 250 is exposed beyond the sidewall spacers 230.

Figure 8:
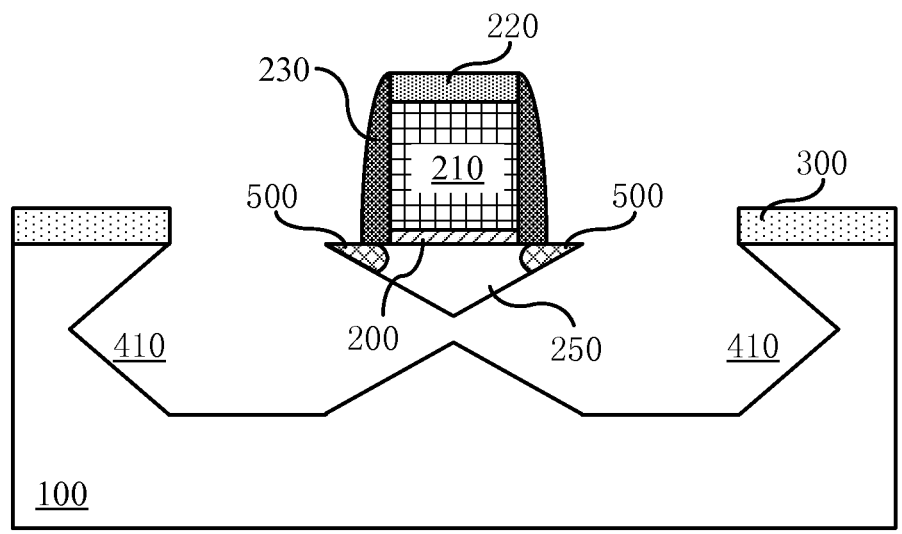
Figure 9:
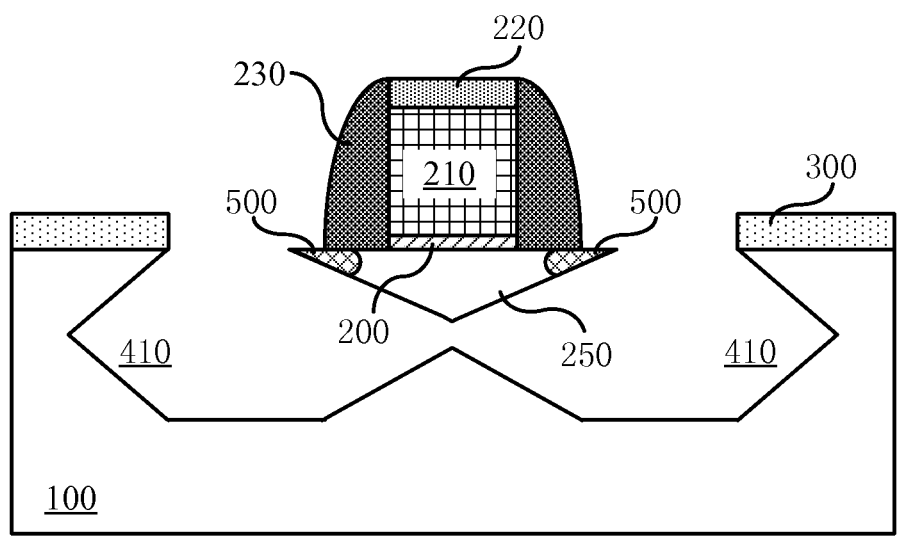

Then, source/drain regions 500 are formed by means of ion implantation, diffusion, or in-situ doping epitaxy method, as shown in FIG. 8 and FIG. 9. In other embodiments of the present invention, source/drain regions 500 may be formed directly in a single step by means of in-situ doping epitaxy method, which simplifies the processing steps.

For PMOS, the source/drain regions 500 may be P-type doped Si; For NMOS, the source/drain regions 500 may be N-type doped Si. Then, rapid annealing is performed to the semiconductor structure to activate the dopants within the source/drain regions 500. The annealing may include rapid annealing, spike annealing or other method as appropriate.

Figure 10:
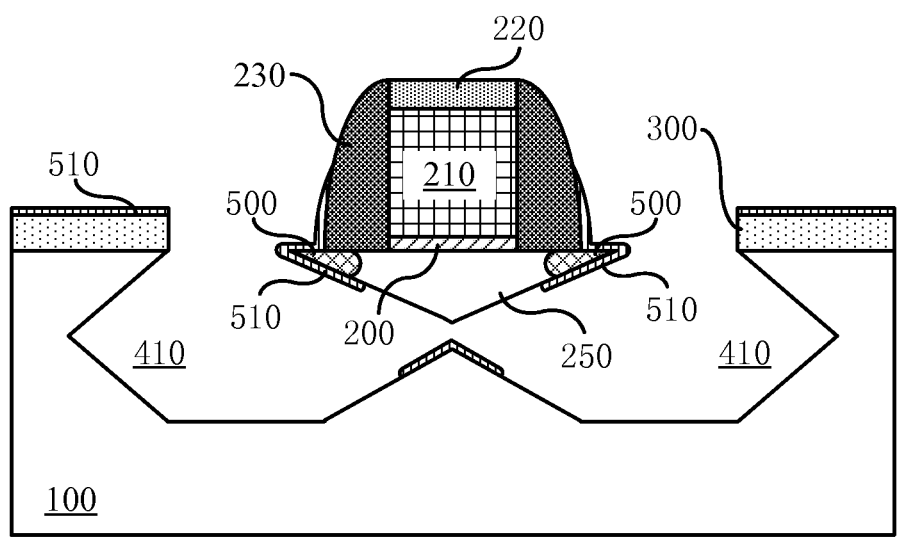
Figure 12:
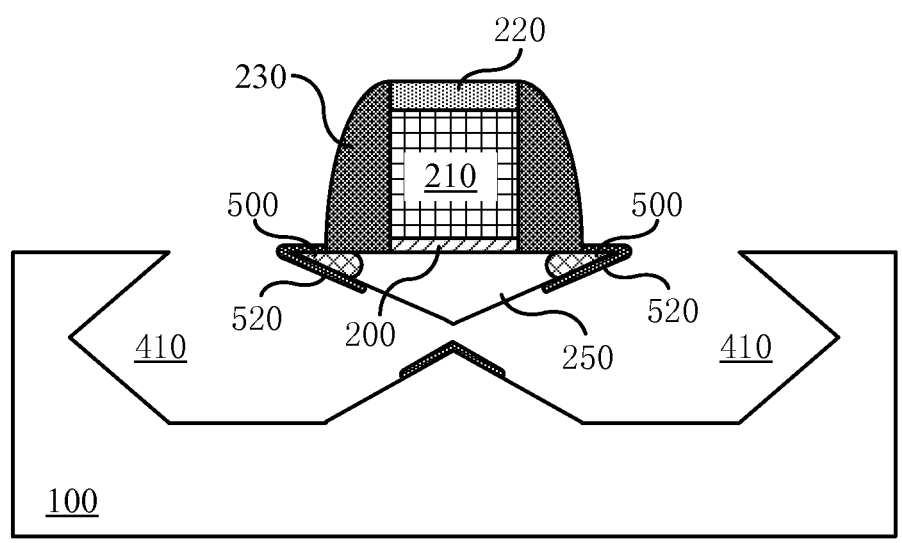

Then, step S104 is implemented to form a contact layer 520. Specifically, a metal layer 510 is formed first at exposed regions of the semiconductor structure by means of tilted sputtering. The tilted sputtering is preferably performed at an angle parallel to Si {111} crystal face, namely, substantially parallel to the sidewalls of the cavity 410 as shown in FIG. 10. The metal layer may comprise one of Co, Ni, Pt and Ti, or combinations thereof, as shown in FIG. 10. Next, annealing is performed to enable the metal layer 510 to react with the surfaces of the source/drain regions 500 to form a contact layer 520, and then the metal layer 510 is removed, as shown in FIG. 11. Finally, the mask layer 300 is removed, as shown in FIG. 12. Additionally, an insulating material (not shown) may be further filled into the cavity 410 according to the specific design requirements in practice.

In subsequent processes for manufacturing the semiconductor structure, an interlayer dielectric layer may be formed over the whole semiconductor structure. A portion of the interlayer dielectric layer will be deposited into the cavity 410. Then, contact trenches may be formed through conventional etching process, wherein, the contact layer 520 may be exposed from the bottom of the contact trenches. Finally, the contact trenches are filled with a metal to form metal vias in contact with the contact layer 520.

Although exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, said method comprising: (a) providing a monocrystalline substrate, forming a gate stack on the substrate, and forming sidewall spacers on sidewalls of the gate stack; (b) forming recesses in the substrates on both sides of the gate stack, and etching through the recesses on both sides of the gate stack by an anistropic wet etching to form a cavity, wherein sidewalls of the cavity are {111} crystal faces, thereby forming a semiconductor base by a portion of the substrate suspended over the cavity;(c) forming source/drain regions within the semiconductor bases on both sides of the gate stack; and (d) forming a contact layer to cover exposed surfaces of the source/drain regions.

2. The method of claim 1, wherein the substrate is made of monocrystalline Si, monocrystalline Ge, monocrystalline SiGe or combinations thereof.

3. The method of claim 1, wherein the crystal orientation of the substrate is <100>.

4. The method of claim 1, wherein step (b) comprises:
forming a mask layer on the substrate and the gate stack; covering the mask layer with a photoresist layer, forming openings on the photoresist layer by exposure and development, wherein the openings are located on both sides of the gate stack; etching portions of the mask layer in the openings and removing the photoresist; and etching the substrate to form recesses on both sides of the gate stack.

5. The method of claim 4, wherein the recesses are formed by dry etching.

6. The method of claim 1, wherein the etching solution for the wet etching at step (b) includes KOH, TMAH, EDP or combinations thereof.

7. The method of claim 6, wherein the etching solution for the wet etching has a concentration of about 5-40% by mass, and the temperature for the wet etching is about 40° C.-90° C.

8. The method of claim 1, wherein forming the contact layer in step (d) comprises: forming a metal layer on exposed surfaces of the source/drain regions, wherein the metal layer is made of one of Co, Ni, Pt and Ti, or combinations thereof; annealing to enable the metal layer to react with the exposed surfaces of the source/drain regions; and removing unreacted portions of the metal layer.

9. The method of claim 8, wherein the metal layer is formed by tilted sputtering.

10. The method of claim 1, wherein step (c) comprises etching the sidewall spacers to expose a portion of the semiconductor base.

* * * * *